(12) United States Patent
Richter et al.

(10) Patent No.: US 10,249,633 B2
(45) Date of Patent: Apr. 2, 2019

(54) FLASH MEMORY DEVICE

(71) Applicant: GLOBALFOUNDRIES Inc., Grand Cayman (KY)

(72) Inventors: Ralf Richter, Radebeul (DE); Sven Beyer, Dresden (DE); Jan Paul, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/831,833

(22) Filed: Dec. 5, 2017

(65) Prior Publication Data

US 2018/0108668 A1    Apr. 19, 2018

Related U.S. Application Data

(62) Division of application No. 15/232,906, filed on Aug. 10, 2016, now Pat. No. 9,871,050.

(51) Int. Cl.
*H01L 27/12* (2006.01)
*H01L 29/423* (2006.01)
(Continued)

(52) U.S. Cl.
CPC .. *H01L 27/11531* (2013.01); *H01L 27/11521* (2013.01); *H01L 27/11526* (2013.01);
(Continued)

(58) Field of Classification Search
CPC ......... H01L 27/11531; H01L 27/11521; H01L 27/11526; H01L 27/1207; H01L 29/42328; H01L 29/42336
See application file for complete search history.

(56) References Cited

U.S. PATENT DOCUMENTS 5,384,473 A   1/1995  Yoshikawa et al.
5,455,792 A  10/1995  Yi
(Continued)

FOREIGN PATENT DOCUMENTS

CN    102956703 A    3/2013
TW    201349461 A   12/2013

OTHER PUBLICATIONS

Examination Report from the Intellectual Property Office for Taiwan Application No. 10720465630 dated May 24, 2018.

*Primary Examiner* — Mark W Tornow
(74) *Attorney, Agent, or Firm* — Amerson Law Firm, PLLC (57) ABSTRACT

An integrated circuit product includes a silicon-on-insulator (SOI) substrate and a flash memory device positioned in a first area of the SOI substrate. The SOI substrate includes a semiconductor bulk substrate, a buried insulating layer positioned above the semiconductor bulk substrate, and a semiconductor layer positioned above the buried insulating layer, and the flash memory device includes a flash transistor device and a read transistor device. The flash transistor device includes a floating gate, an insulating layer positioned above the floating gate, and a control gate positioned above the insulating layer, wherein the floating gate includes a portion of the semiconductor layer. The read transistor device includes a gate dielectric layer positioned above the semiconductor bulk substrate and a read gate electrode positioned above the gate dielectric layer.

20 Claims, 4 Drawing Sheets

(51) Int. Cl.
*H01L 27/11521* (2017.01)
*H01L 27/11526* (2017.01)
*H01L 27/11531* (2017.01)

(52) U.S. Cl.
CPC .... *H01L 27/1207* (2013.01); *H01L 29/42328* (2013.01); *H01L 29/42336* (2013.01)

(56) References Cited

U.S. PATENT DOCUMENTS

| | | | |
|---|---|---|---|
| 5,593,915 | A | 1/1997 | Ohoka |
| 5,994,188 | A | 11/1999 | Disney |
| 6,020,606 | A * | 2/2000 | Liao .................. H01L 21/28282 257/213 |
| 9,054,221 | B2 | 6/2015 | Zhu et al. |
| 2003/0151112 | A1 | 8/2003 | Yamada et al. |
| 2008/0175053 | A1 | 7/2008 | Lue et al. |
| 2016/0163876 | A1* | 6/2016 | Wu .................. H01L 29/66825 257/320 |
| 2016/0276451 | A1* | 9/2016 | Golanski ............. H01L 27/1207 |
| 2016/0300884 | A1* | 10/2016 | Grenouillet ............. H01L 45/08 |

* cited by examiner

FLASH MEMORY DEVICE

BACKGROUND

1. Field of the Disclosure

Generally, the present disclosure relates to the field of integrated circuits and semiconductor devices and, more particularly, to the manufacture of flash memory devices and, more particularly, to the manufacture of flash memory devices on FDSOI substrates.

2. Description of the Related Art

The fabrication of advanced integrated circuits, such as CPUs, storage devices, application specific integrated circuits (ASICs) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors (FETs), wherein, for many types of complex circuitry, MOS technology is currently one of the most promising approaches due to the superior characteristics in view of operating speed and/or power consumption and/or cost efficiency. During the fabrication of complex integrated circuits using, for instance, CMOS technology, millions of N-channel transistors and P-channel transistors are formed on a substrate including a crystalline semiconductor layer. Moreover, in many applications, flash memory devices comprising transistor devices are needed.

A flash memory (for example, a FLASH EPROM or FLASH EEPROM) is a semiconductor device that is formed from an array of memory cells (devices), with each cell having a floating gate transistor. Flash memory chips fall into two main categories, namely, those having a so-called "NOR" architecture and those having a so-called "NAND" architecture. Data can be written to each cell within the array, but the data is erased in blocks of cells. Each floating gate transistor comprises a source, a drain, a floating gate and a control gate. The floating gate uses channel hot electrons for writing from the drain and tunneling for erasure from the source. The sources of each floating gate in each cell in a row of the array are connected to form a source line. In embedded memory solutions, memory cells are provided in the neighborhood of logic devices and are, particularly, together with the logic devices on a single (monolithic) silicon substrate. Flash memory devices are used in many applications, including hand-held computing devices, wireless telephones and digital cameras, as well as automotive applications. To enable the individual memory elements of a flash memory chip to maintain the physical state with which they have been programmed, each memory region must be isolated from its neighboring regions, typically by shallow trench isolations.

Figure 1:
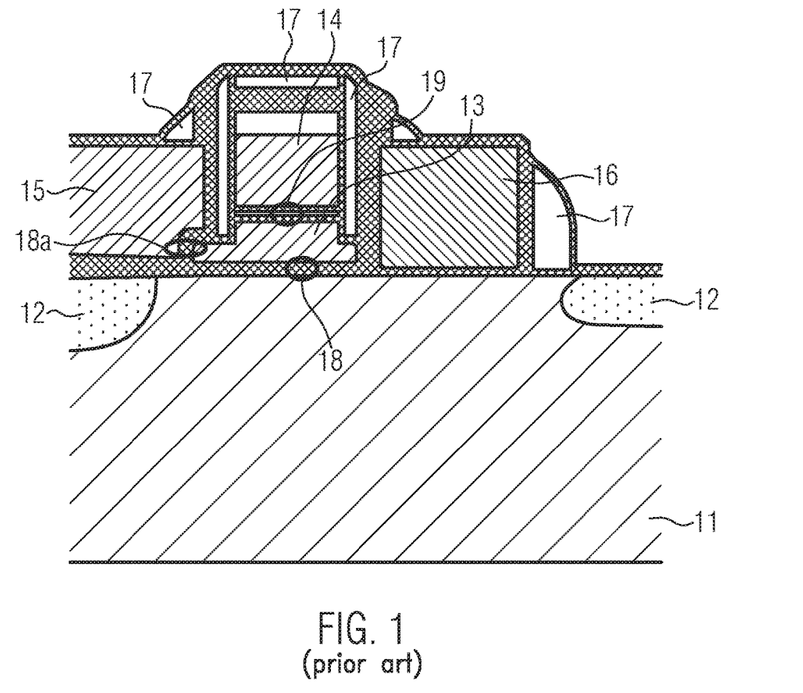
FIG. 1 illustrates a flash memory device of the prior art.

A variety of single gate and split gate solutions for embedded memory cell architectures are known in the art. FIG. 1 illustrates, for exemplary purposes, an embedded super flash cell of the prior art. The cell is formed on a semiconductor substrate 11 wherein source/drain regions 12 are formed. The cell comprises a floating gate 13, a control gate 14, an erase gate 15 and a select gate 16 formed by a word line. All gates may be made of polysilicon and they are covered by a multilayer insulation structure 17. The multilayer insulation structure 17 comprises parts of spacer structures formed on the tops and sidewalls of the gates. The floating gate 13 is formed over a floating gate oxide layer 18 and it is separated from the erase gate 15 by a tunnel oxide layer 18a that may be formed of the same material as the floating gate oxide layer 18. The control gate 14 and the floating gate 13 are separated from each other by an isolation layer 19, for example, an oxide-nitride-oxide (ONO) layer provided in order to enhance the capacitive coupling between the floating gate 13 and the control gate 14.

However, whereas flash cell integration in the context of manufacturing of field effect transistors (FETs) with silicon-oxynitride gate dielectrics can be reliably achieved, integration of flash cells in CMOS technologies used for the formation of FETs (and, for example, comprising the formation of high-k metal gate transistor devices) still poses challenging problems. Particularly, in the context of Fully Depleted Silicon-On-Insulator (FDSOI) Complementary Metal-Oxide-Semiconductor (CMOS) manufacturing techniques, co-integration of non-volatile memory cells as flash memory cells requires many additional deposition and masking steps.

Figure 2:
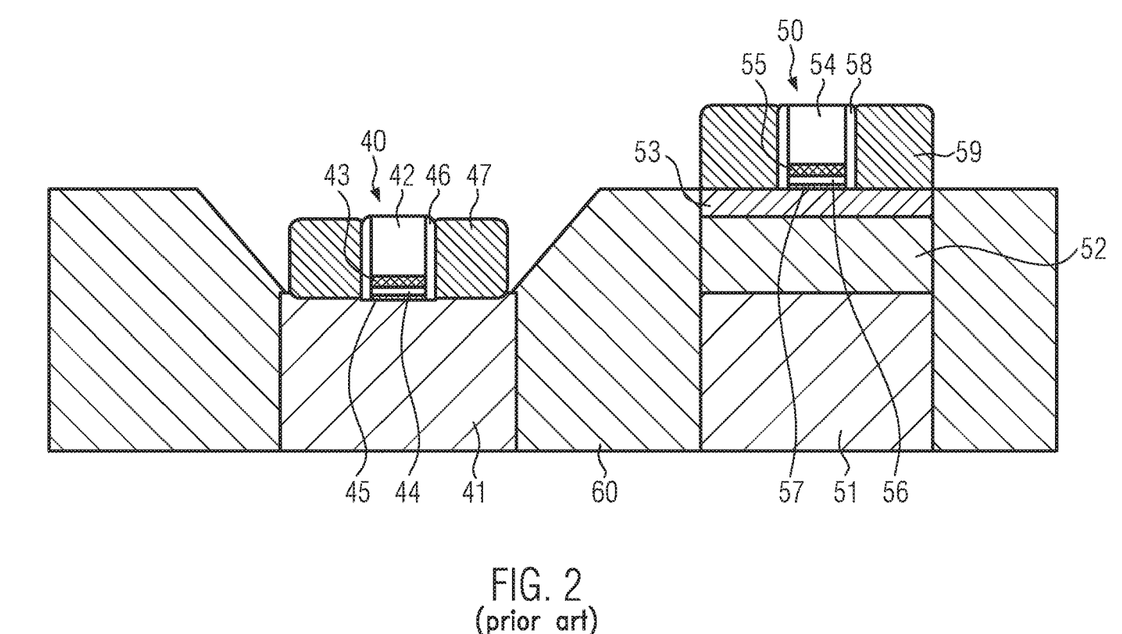
FIG. 2 illustrates an SOI semiconductor device of the prior art that comprises a bulk transistor and an FDSOI transistor.

FIG. 2 shows a typical semiconductor device or integrated circuit product comprising a bulk transistor device 40 and an FDSOI transistor device 50. The bulk transistor device 40 and the FDSOI transistor device 50 are isolated from each other by some form of isolation region 60. The bulk transistor device 40 is formed on a semiconductor bulk substrate 41 that provides a channel region in a top region of the bulk substrate 41. The bulk transistor device 40 comprises a polysilicon gate electrode layer 42, a metal gate electrode layer 43, a work function adjusting layer 44 and a gate dielectric layer 45 that, for example, is a high-k dielectric layer. Furthermore, the bulk transistor device 40 comprises a sidewall spacer 46 and raised source/drain regions 47.

The FDSOI transistor device 50 is formed on an SOI substrate that comprises a semiconductor bulk substrate 51, a buried oxide layer 52 formed on the semiconductor bulk substrate 51 and a semiconductor layer 53 that provides a channel region of the FDSOI transistor device 50. Further, the FDSOI transistor device 50 comprises a polysilicon gate electrode layer 54, a metal gate electrode layer 55, a work function adjusting layer 56 and a gate dielectric layer 57 that, for example, is a high-k dielectric layer. A sidewall spacer 58 is formed at sidewalls of the above-mentioned layers and raised source/drain regions 59 are formed by epitaxy on the surface of the semiconductor layer 53. The process flow of manufacturing the semiconductor device shown in FIG. 2 can be optimized with respect to the number of mask layers, etching processes, implantation processes, etc. However, in the prior art, the integration of the manufacture of flash memory devices in that process flow requires additional deposition and masking steps, thereby significantly increasing the complexity of the overall processing and manufacturing costs.

In view of the situation described above, the present disclosure provides a technique of forming a semiconductor device comprising a flash memory device integrated within (FD)SOI technologies with a reduced number of processing steps as compared to the art. In addition, a semiconductor device comprising a flash memory device formed according to a method of manufacturing in accordance with the present disclosure is provided.

SUMMARY OF THE DISCLOSURE

The following presents a simplified summary of the disclosure in order to provide a basic understanding of some aspects of the subject matter that is described in further detail below. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally the subject matter disclosed herein relates to the manufacturing of a semiconductor device, for example, an FDSOI semiconductor device, comprising a memory device, in particular, a non-volatile flash memory device. Due to the particular manufacturing technique disclosed herein, the formation of the memory device can be integrated in a process flow of FDSOI manufacturing.

In one illustrative embodiment, an integrated circuit product is disclosed that includes a silicon-on-insulator (SOI) substrate and a flash memory device positioned in a first area of the SOI substrate. The SOI substrate includes a semiconductor bulk substrate, a buried insulating layer positioned above the semiconductor bulk substrate, and a semiconductor layer positioned above the buried insulating layer. Additionally, the flash memory device includes, among other things, a flash transistor device and a read transistor device, wherein the flash transistor device includes a floating gate, an insulating layer positioned above the floating gate, and a control gate positioned above the insulating layer, and the floating gate includes a portion of the semiconductor layer. Furthermore, the read transistor device includes a gate dielectric layer positioned above the semiconductor bulk substrate and a read gate electrode positioned above the gate dielectric layer.

In another exemplary embodiment of the present disclosure, an integrated circuit product includes a silicon-on-insulator (SOI) substrate having a semiconductor bulk substrate, a buried oxide layer positioned above the semiconductor bulk substrate, and a semiconductor layer positioned above the buried oxide layer. The disclosed integrated circuit product further includes a flash memory device positioned in a first area of the SOI substrate, wherein the flash memory device includes a flash transistor device and a read transistor device. The flash transistor device includes, among other things, a floating gate, an insulating layer positioned on an upper surface of the floating gate, and a control gate positioned on an upper surface of the insulating layer, wherein the floating gate includes a first portion of the semiconductor layer and the insulating layer includes an oxide-nitride-oxide multi-layer. Additionally, the read transistor device includes a gate dielectric layer positioned above the semiconductor bulk substrate and a read gate electrode positioned above the gate dielectric layer. Furthermore, the exemplary integrated circuit product also includes a fully depleted silicon-on-insulator (FDSOI) transistor device positioned in a second area of the SOI substrate that is electrically isolated from the first area, wherein the FDSOI transistor device includes a second portion of the semiconductor layer.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the subject matter defined by the appended claims to the particular forms disclosed, but on the contrary, the intention is to cover all modifications, equivalents, and alternatives falling within the spirit and scope of the claimed subject matter.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various systems, structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As used in this description and in the appended claims, the terms "substantial" or "substantially" are intended to conform to the ordinary dictionary definition of that term, meaning "largely but not wholly that which is specified." As such, no geometrical or mathematical precision is intended by the use of terms such as "substantially flat," "substantially perpendicular," "substantially parallel," "substantially circular," "substantially elliptical," "substantially rectangular," "substantially square," "substantially aligned," and/or "substantially flush," and the like. Instead, the terms "substantial" or "substantially" are used in the sense that the described or claimed component or surface configuration, position, or orientation is intended to be manufactured, positioned, or oriented in such a configuration as a target.

For example, the terms "substantial" or "substantially" should be interpreted to include components and surfaces that are manufactured, positioned, or oriented as close as is reasonably and customarily practicable within normally accepted tolerances for components of the type that are described and/or claimed. Furthermore, the use of phrases such as "substantially conform" or "substantially conforms" when describing the configuration or shape of a particular component or surface, such as by stating that "the configuration of the component substantially conforms to the configuration of a rectangular prism," should be interpreted in similar fashion.

Furthermore, it should be understood that, unless otherwise specifically indicated, any relative positional, directional, or spatial references that may be used in the descriptions set forth below—such as "upper," "lower," "above," "below," "over," "under," "top," "bottom," "vertical," "horizontal," "lateral," and the like—may be used for convenience when referring to structures of semiconductor devices. These references are intended to be used in a manner consistent with the drawings only for teaching purposes, and are not intended as absolute references for semiconductor device structures. For example, FETs or memory devices may be oriented spatially in any manner different from the orientations shown in the drawings. "Vertical" is used to refer to a direction normal to the semiconductor layer surface, and "horizontal" is used to refer to a direction parallel to the semiconductor layer surface when referring to the drawings. "Upper" is used to refer to a vertical direction away from the semiconductor layer. An element positioned "above" ("below") another one is located farther away from (closer to) the semiconductor layer surface as compared to the other one.

Generally, manufacturing techniques and semiconductor devices in which N-channel transistors and/or P-channel transistors and memory cells may be formed are described herein. The manufacturing techniques may be integrated in CMOS manufacturing processes. As will be readily apparent to those skilled in the art upon a complete reading of the present application, the present method is applicable to a variety of technologies, for example, NMOS, PMOS, CMOS, etc., and is readily applicable to a variety of devices, including, but not limited to, logic devices, memory devices, SRAM devices, etc., in principle. The techniques and technologies described herein may be utilized to fabricate MOS integrated circuit devices, including NMOS integrated circuit devices, PMOS integrated circuit devices and CMOS integrated circuit devices. In particular, the process steps described herein are utilized in conjunction with any semiconductor device fabrication process that forms gate structures for integrated circuits, including both planar and nonplanar integrated circuits. Although the term "MOS" properly refers to a device having a metal gate electrode and an oxide gate insulator, that term is used throughout to refer to any semiconductor device that includes a conductive gate electrode (whether metal or other conductive material) that is positioned over a gate insulator (whether oxide or other insulator) which, in turn, is positioned over a semiconductor substrate.

The present disclosure, generally, provides techniques for the formation of flash memory devices within (FD)SOI processing. In particular, a manufacturing technique of a flash memory device integrated in the process flow of the formation of a high-k dielectric-metal (-poly) gate FET is provided.

Figure 3:
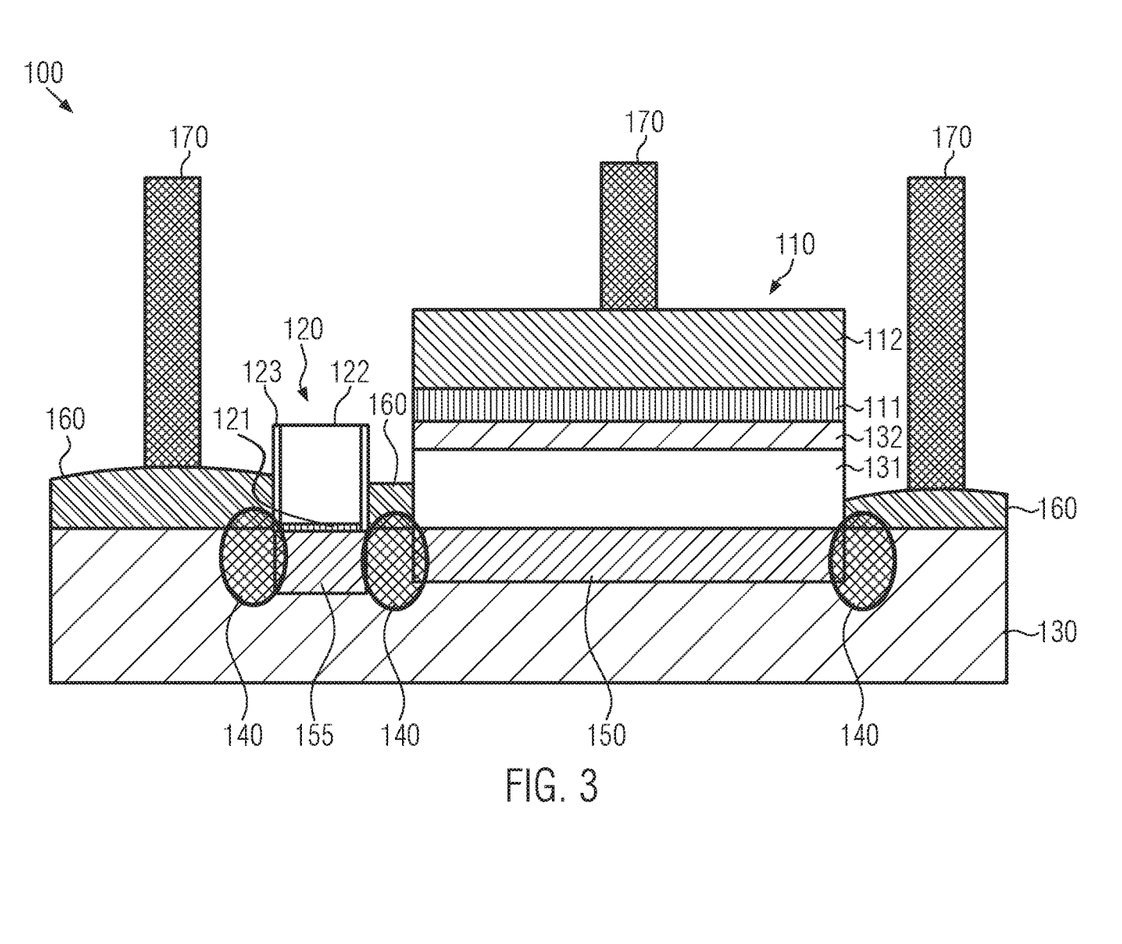
FIG. 3 shows a flash memory device comprising a flash transistor device and a read transistor device according to an example of the present disclosure.

FIG. 3 shows a flash memory device 100 comprising a flash transistor device 110 and a read transistor device 120 (connected in series to each other) according to an example of the present disclosure. The read transistor device 120 is configured to read a state (1 or 0) of the flash transistor device 110. The flash transistor device 110 and the read transistor device 120 are formed in and above an SOI substrate comprising a semiconductor bulk substrate 130, a buried insulating layer 131 formed on an upper surface of the semiconductor bulk substrate 130, and a semiconductor layer 132 formed on an upper surface of the buried insulating layer 131. The semiconductor layer 132 may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon, silicon/germanium, silicon/carbon, other II-VI or III-V semiconductor compounds and the like.

In certain embodiments, the buried insulating layer 131 may be an oxide material layer, such silicon (di)oxide or a borosilicate glass or a borophosphosilicate glass (BPSG) material, which may sometimes be referred to herein in shorthand fashion as a buried oxide layer 131, or BOX layer 131. In some exemplary embodiments, the BOX layer 131 may be composed of multiple different material layers, wherein one of the different material layers may comprise BPSG or a silicon (di)oxide compound that comprises boron or phosphorus. Furthermore, the semiconductor bulk substrate 130 may provide a back gate for the flash transistor device 110. The semiconductor bulk substrate 130 may comprise or consist of silicon, in particular, single crystal silicon. Other materials may be used to form the semiconductor bulk substrate such as, for example, germanium, silicon germanium, gallium phosphate, gallium arsenide, etc. For example, the thickness of the semiconductor layer 132 may be in the range of 5-20 nm, in particular, 5-10 nm, and the thickness of the BOX layer may be in the range of 10-50 nm, in particular, 10-30 nm and, more particularly, 15-25 nm.

Both the BOX layer 131 and the semiconductor layer 132 were removed in the region where the read transistor device 120 is formed. The semiconductor layer 132 provides the floating gate of the flash transistor device 110. Isolation regions 140 are formed in the semiconductor bulk substrate 130 for electrical isolation of the flash transistor device 110 and the read transistor device 120. A well 150 is formed below the BOX layer 131 and the floating gate 132 in the semiconductor bulk substrate 130 by appropriate implantation of dopants for adjusting the threshold voltage of the flash transistor device 110. Similarly, another well 155 is formed by appropriate implantation of dopants in the semiconductor bulk substrate 130 for adjusting the threshold voltage of the read transistor device 120. Suitable dopants may include boron, arsenic and phosphorous species.

The flash transistor device 110, furthermore, comprises an insulating layer (tunneling oxide) 111 that is formed on an upper surface of the floating gate 132, and a control gate (program/erase gate) 112 that is formed on an upper surface of the insulating layer 111. In some embodiments, the insulating layer 111 may be provided over the SOI substrate in the form of an oxide-nitride-oxide (ONO) multi-layer in order to enhance the capacitive coupling between the floating gate 132 and the control gate 112. Furthermore, while the insulating layer 111 may be referred to herein as an ONO layer, it should be understood that the insulating layer 111 may be made differently, for example, it may be formed of a single layer of silicon oxynitride or some oxide only.

The read transistor device 120 comprises a gate dielectric layer 121 directly formed on an upper surface of the semiconductor layer 130 and a read gate electrode 122 formed over the gate dielectric layer 121. Moreover, a sidewall spacer 123 is formed on sidewalls of the read gate electrode 122. The sidewall spacer 123 may include silicon dioxide and/or silicon nitride. The sidewall spacer 123 may be provided in the form of multilayers by subsequently epitaxially growing or depositing the respective layers on the sidewalls of the gate and appropriately etching them.

The gate dielectric layer 121 may be a high-k dielectric layer, for example, with a dielectric constant k>5, k>10 or k>13, that may comprise a transitional metal oxide, such as at least one of hafnium oxide, hafnium dioxide and hafnium silicon-oxynitride. A work function adjusting layer (not shown in FIG. 3) may be formed on the high-k dielectric layer and may comprise titanium nitride (TiN) or any other appropriate work function adjusting metal or metal oxide that is known in the art.

Both the control gate 112 of the flash transistor device 110 and the read gate electrode 122 of the read transistor device 120 may comprise a metal gate layer and/or a polysilicon layer. The metal gate layer, for example, comprises a plurality of layers that may include Al, AlN or TiN. In particular, the metal gate layer may comprise a work function adjusting material that comprises an appropriate transition metal nitride, for example, those from groups 4-6 in the periodic table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) and the like, with a thickness of about 1-60 nm, i.e., the work function adjusting layer may be integrated in the metal gate layer.

Furthermore, raised source/drain regions 160 may be formed on the surface of the semiconductor bulk substrate 130. The flash transistor device 110 and the read transistor device 120 share one of the raised source/drain regions 160. The raised source/drain regions 160 may be formed by epitaxially growing a semiconductor material on the surface of the semiconductor bulk substrate 130. The semiconductor material may be appropriately doped during the epitaxial growth or after completion of the growth process.

The raised source/drain regions 160, the control gate 112 of the flash transistor device 110 and the read gate electrode 122 of the read transistor device 120 can be electrically contacted by means of contacts 170 that may be formed on an interlayer dielectric formed over the flash transistor device 110 and the read transistor device 120. The interlayer dielectric may be made of an oxide material and it may comprise silicon dioxide. In particular, the control gate 112 can be contacted via a contact 170 to a word line. The raised source/drain regions 160 and/or the control gate 112 and/or the read gate electrode 122 may be silicided in order to reduce the contact resistance.

The steps of manufacturing the configuration shown in FIG. 3 include providing an SOI substrate, removing the semiconductor layer 132 and the BOX layer 131 in a particular area of the SOI substrate, forming the gate dielectric 121 of the read transistor device 120 on the exposed surface of the semiconductor bulk substrate 130 and forming the read gate electrode 122 on the gate dielectric 121. Before or after the partial removal of the semiconductor layer 132 and the BOX layer 131, implantation processes may be performed to form the wells 150 and 155. The insulating layer 111 of the flash transistor device 110 is formed on the floating gate 132 and the control electrode 112 is formed on the insulating layer 111. The formation of the different layers includes masking and etching steps in the context of conventional lithography. The masking may include the formation and structuring of a hard mask layer comprising silicon nitride (SiN), for instance. A silicon nitride hard mask may be used for partially removing the semiconductor layer 132 and BOX layer 131 of the SOI substrate in order to form the gate dielectric 121 of the read transistor device 120 directly on the semiconductor bulk substrate 130. The formation of the isolation regions 140 includes etching of openings into the semiconductor bulk substrate 130 and filling the openings with some isolation material, for example, comprising an oxide material.

The flash transistor device 110 and the read transistor device 120 can both be formed as N-channel or P-channel transistors. During a read operation, the read transistor device 120 is turned on. Current flow in the channel (formed in the semiconductor bulk substrate 130) depends on the charge stored in the floating gate 132 of the flash transistor device 110. Programming and erasing of the floating gate 132 is realized by Fowler-Nordheim tunneling through the insulating layer 111. If the flash transistor device 110 and the read transistor device 120 are formed as N-channel transistors, the flash transistor device 110 may represent a zero threshold voltage device. Without negative net charge present on the floating gate 132 (representing an erase state), the channel of the flash transistor device 110 (formed in the semiconductor bulk substrate 130) is in a conducting state. This state can be detected by the read transistor device 120. With negative net charge present on the floating gate 132, the threshold voltage of the flash transistor device 110 is changed to a positive value. In a read mode (i.e., no voltage is applied to the control gate 112), the read transistor device 120 detects a relatively low current (representing a programming state).

It is noted that the floating gate 132 of the flash transistor device 110 may be operated to be over-erased, i.e., it may be in a state of carrying a positive net charge. In such cases, requirements regarding zero threshold voltage can be relaxed. According to another alternative, a finite voltage may be applied to the control gate 112 during the read mode. Again, this may relax the zero voltage device requirement. As a further option, a finite voltage may be applied to the semiconductor bulk substrate 130 during programming and/or erasing and/or reading operation.

Figure 4:
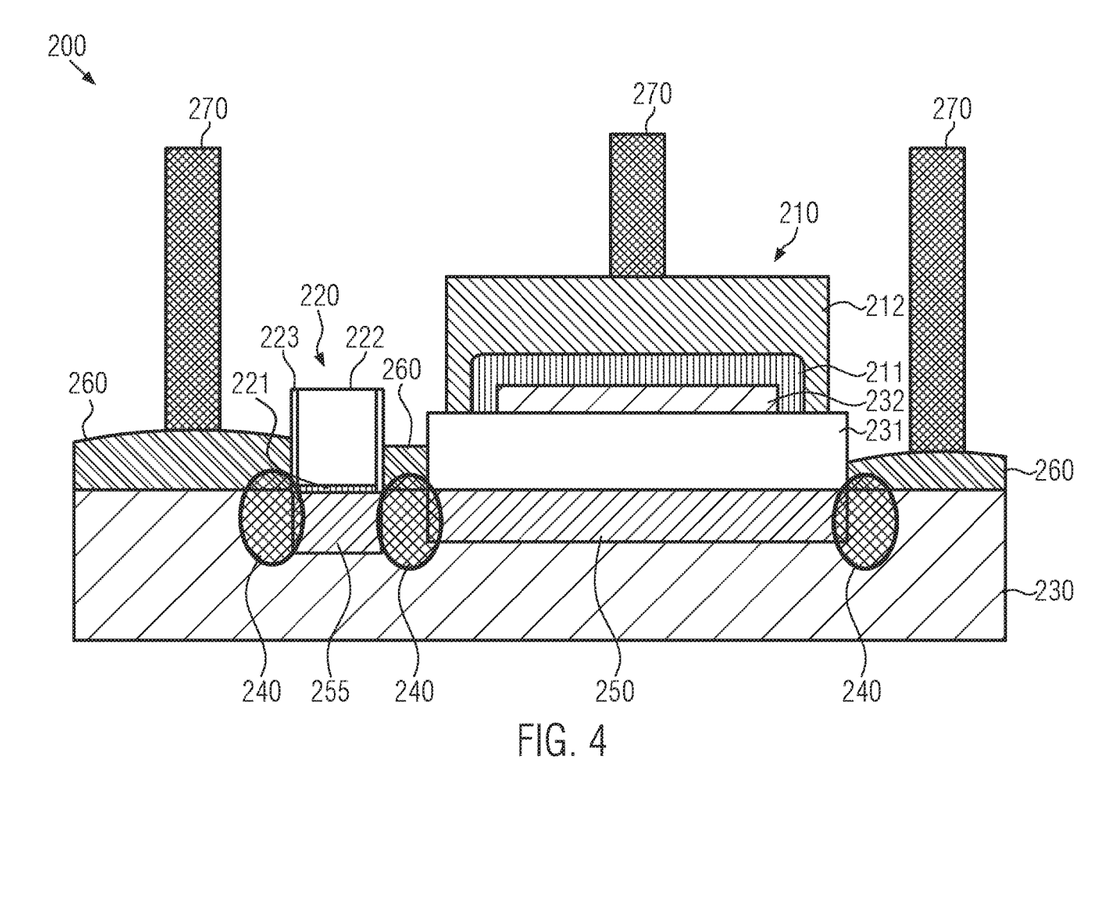
FIG. 4 shows a flash memory device comprising a flash transistor device and a read transistor device according to another example of the present disclosure.

A flash memory device 200 according to another example of the present disclosure is illustrated in FIG. 4. The flash memory device 200 comprises a flash transistor device 210 and a read transistor device 220 (connected in series to each other). The flash transistor device 210 and the read transistor device 220 are formed in and above an SOI substrate comprising a semiconductor bulk substrate 230, a buried insulating layer 231, e.g., a buried oxide (BOX) layer 231, formed on an upper surface of the semiconductor bulk substrate 230, and a semiconductor layer 232 formed on an upper surface of the buried insulating (e.g., BOX) layer 231. The flash transistor device 210 and the read transistor device 220 are electrically isolated by isolation regions 240. Wells 250 and 255 are respectively formed to adjust the threshold voltages of the flash transistor device 210 and the read transistor device 220.

The semiconductor layer 232 provides for the floating gate of the flash transistor device 210. An insulating layer (for example, an ONO layer) 211 is formed on an upper surface of the floating gate 232, and a control gate 212 is formed on an upper surface of the insulating layer 211. Contacts 270 are provided for electrically contacting the electrodes 212, 222. Materials and dimensions of all elements shown in FIG. 4 can be chosen as described above with reference to the example shown in FIG. 3.

The configuration shown in FIG. 4 only differs from the one shown in FIG. 3 by the arrangement of the insulating layer 211 and the control electrode 212 with respect to the floating gate 232. As shown in FIG. 4, the insulating layer 211 and the control electrode 212 are formed to overlap the edges of the floating gate 232, such that the insulating layer 211 is formed on the sidewall surfaces of the floating gate 232 in addition to the upper surface of the floating gate 232, and the control electrode 212 is formed on the sidewall surfaces of the insulating layer 211 in addition to the upper surface of the insulating layer 211. In this way, tunneling may be improved, and the programming/erasing operation of the control electrode 212 may thus be accelerated.

The above-described manufacturing of a flash memory device may be readily integrated in the process flow of manufacturing fully depleted silicon-on-insulator (FDSOI) semiconductor devices (such as, for example, the semiconductor device comprising a bulk transistor and an FDSOI transistor as shown in FIG. 2, wherein the FDSOI semiconductor devices may be formed in and above the semiconductor layer 132 of the SOI substrate). In particular, the control electrode 112, 212 of the flash transistor device 110, 210 and the read gate electrode 122, 222 of the read transistor device 210, 220 may be formed in the same process module used for the high-k metal gate manufacturing of FETs in other areas of the die. All of the gate electrodes may be formed of the same material in the same processing step. In this case, only an additional module for the formation of the insulating layer (ONO layer) 111, 211 is needed to enable the manufacture of a flash memory device 110, 210 on an FDSOI platform used for manufacturing of FETs used as logic control elements like switches. The read gate electrode 122, 222 of the read transistor device 210, 220 can alternatively be formed by an additional poly/non-high-k metal gate module.

As a result, the present disclosure provides techniques for the integration of the formation of a memory device, in particular, a flash memory device, in the (FD)SOI manufacturing process flow of FETs and it also provides semiconductor devices comprising flash memory devices. The flash memory device may be part of a NOR or NAND flash memory cell. The (FD)SOI manufacturing of reliably operating semiconductor devices comprising memory cells and logic devices may be significantly improved as compared to the art, since the number of additional deposition and masking steps needed for the formation of the memory device is significantly reduced. Particularly, the memory device may comprise a semiconductor layer of an (FD)SOI substrate as a floating gate. The disclosed devices can suitably be produced in the context of advanced 22 nm technologies.

The particular embodiments disclosed above are illustrative only, as the subject matter defined by the appended claims may be modified and practiced in different but equivalent manners apparent to those skilled in the art having the benefit of the teachings herein. For example, some or all of the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the claimed subject matter. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   a silicon-on-insulator (SOI) substrate comprising a semiconductor bulk substrate, a buried insulating layer positioned above said semiconductor bulk substrate, and a semiconductor layer positioned above said buried insulating layer; and
   a flash memory device positioned in a first area of said SOI substrate, said flash memory device comprising:
      a flash transistor device comprising a floating gate, an insulating layer positioned above said floating gate, and a control gate positioned above said insulating layer, said floating gate comprising a portion of said semiconductor layer; and
      a read transistor device comprising a gate dielectric layer positioned above said semiconductor bulk substrate and a read gate electrode positioned above said gate dielectric layer; and
   a fully depleted silicon-on-insulator (FDSOI) transistor device positioned in a second area of said SOI substrate that is electrically isolated from said first area, wherein said FDSOI transistor device comprises a second portion of said semiconductor layer, a high-k gate dielectric layer positioned above said second portion of said semiconductor layer, and a first metal gate layer positioned above said high-k gate dielectric layer.

2. The integrated circuit product of claim 1, wherein said buried insulating layer is a buried oxide (BOX) layer.

3. The integrated circuit product of claim 1, wherein said insulating layer is positioned on an upper surface and on sidewall surfaces of said floating gate, and wherein said control gate is positioned on an upper surface and on sidewall surfaces of said insulating layer.

4. The integrated circuit product of claim 1, wherein said insulating layer is an oxide-nitride-oxide multi-layer.

5. The integrated circuit product of claim 1, wherein at least one of said flash transistor device and said read transistor device comprises raised source/drain regions.

6. The integrated circuit product of claim 1, wherein said flash transistor device comprises a first doped well region positioned in said semiconductor bulk substrate below said floating gate and said read transistor device comprises a second doped well region positioned in said semiconductor bulk substrate below said read gate electrode, said first doped well region being doped differently from said second doped well region.

7. An integrated circuit product, comprising:
   a silicon-on-insulator (SOI) substrate comprising a semiconductor bulk substrate, a buried oxide layer positioned above said semiconductor bulk substrate, and a semiconductor layer positioned above said buried oxide layer;
   a flash memory device positioned in a first area of said SOI substrate, said flash memory device comprising:
      a flash transistor device comprising a floating gate, an insulating layer positioned on an upper surface of said floating gate, and a control gate positioned on an upper surface of said insulating layer, wherein said floating gate comprises a first portion of said semiconductor layer and said insulating layer comprises an oxide-nitride-oxide multi-layer; and a read transistor device comprising a gate dielectric layer positioned above said semiconductor bulk substrate and a read gate electrode positioned above said gate dielectric layer; and a fully depleted silicon-on-insulator (FDSOI) transistor device positioned in a second area of said SOI substrate that is electrically isolated from said first area, wherein said FDSOI transistor device comprises a second portion of said semiconductor layer.

8. The integrated circuit product of claim 7, wherein said insulating layer is also positioned on sidewall surfaces of said floating gate, and wherein said control gate is also positioned on sidewall surfaces of said insulating layer.

9. The integrated circuit product of claim 7, wherein at least one of said flash transistor device and said read transistor device comprises raised source/drain regions.

10. The integrated circuit product of claim 7, wherein said flash transistor device comprises a first doped well region positioned in said semiconductor bulk substrate below said floating gate and said read transistor device comprises a second doped well region positioned in said semiconductor bulk substrate below said read gate electrode, said first doped well region being doped differently from said second doped well region.

11. The integrated circuit product of claim 7, wherein said FDSOI transistor device further comprises a high-k gate dielectric layer positioned above said second portion of said semiconductor layer, and a first metal gate layer positioned above said high-k gate dielectric layer.

12. The integrated circuit product of claim 11, wherein at least one of said control gate of said flash transistor device and said read gate electrode of said read transistor device comprises a second metal gate layer.

13. The integrated circuit product of claim 12, wherein said second metal gate layer is a same material as said first metal gate layer.

14. An integrated circuit product, comprising:
a silicon-on-insulator (SOI) substrate comprising a semiconductor bulk substrate, a buried insulating layer positioned above said semiconductor bulk substrate, and a semiconductor layer positioned above said buried insulating layer; and a flash memory device positioned in a first area of said SOI substrate, said flash memory device comprising:
 a flash transistor device comprising a floating gate, an insulating layer positioned above said floating gate, and a control gate positioned above said insulating layer, said floating gate comprising a portion of said semiconductor layer; and
 a read transistor device comprising a gate dielectric layer positioned above said semiconductor bulk substrate and a read gate electrode positioned above said gate dielectric layer, wherein at least one of said control gate of said flash transistor device and said read gate electrode of said read transistor device comprises a first metal gate layer; and a fully depleted silicon-on-insulator (FDSOI) transistor device positioned in a second area of said SOI substrate that is electrically isolated from said first area, wherein said FDSOI transistor device comprises a second portion of said semiconductor layer, a high-k gate dielectric layer positioned above said second portion of said semiconductor layer, and a second metal gate layer positioned above said high-k gate dielectric layer.

15. The integrated circuit product of claim 14, wherein said first metal gate layer of said at least one of said control gate and said read gate electrode comprises a same material as said second metal gate layer of said FDSOI transistor device.

16. The integrated circuit product of claim 14, wherein said buried insulating layer is a buried oxide (BOX) layer.

17. The integrated circuit product of claim 14, wherein said insulating layer is positioned on an upper surface and on sidewall surfaces of said floating gate, and wherein said control gate is positioned on an upper surface and on sidewall surfaces of said insulating layer.

18. The integrated circuit product of claim 14, wherein said insulating layer is an oxide-nitride-oxide multi-layer.

19. The integrated circuit product of claim 14, wherein at least one of said flash transistor device and said read transistor device comprises raised source/drain regions.

20. The integrated circuit product of claim 14, wherein said flash transistor device comprises a first doped well region positioned in said semiconductor bulk substrate below said floating gate and said read transistor device comprises a second doped well region positioned in said semiconductor bulk substrate below said read gate electrode, said first doped well region being doped differently from said second doped well region.

* * * * *